United States Patent [19]

Robertson

[11] Patent Number: 4,466,038
[45] Date of Patent: Aug. 14, 1984

[54] HYBRID POWER SWITCH

[75] Inventor: Raymond A. Robertson, Dover, N.J.

[73] Assignee: Hewlett-Packard Company, Palo Alto, Calif.

[21] Appl. No.: 344,853

[22] Filed: Feb. 1, 1982

[51] Int. Cl.³ .............................................. H02H 7/20
[52] U.S. Cl. .......................................... 361/8; 361/13; 307/134
[58] Field of Search .................... 361/3, 8, 13, 5, 6, 361/7, 2; 307/134, 135

[56] References Cited

U.S. PATENT DOCUMENTS 3,237,030  2/1966  Coburn .............................. 361/8 X
4,068,273  1/1978  Metzler ................................ 361/3
4,356,525  10/1982  Kornrumpf et al. ............... 361/3 X Primary Examiner—Patrick R. Salce
Attorney, Agent, or Firm—Donald N. Timbie

[57] ABSTRACT

A hybrid power switch for AC voltage in which an SCR switch is in parallel with a mechanical switch. They are operated so that the SCR switch is closed whenever the mechanical switch is to be opened or closed. Circuits are included for closing the hybrid switch when the AC voltage is zero and for opening it when the current is zero.

2 Claims, 17 Drawing Figures

HYBRID POWER SWITCH

BACKGROUND OF THE INVENTION

This invention relates to improved apparatus for switching alternating current voltage between an input and an output. Circuits previously used for this purpose dissipate too much power and produce too much radio frequency interference. The simplest switch is a mechanical relay. It produces large amounts of RFI on both opening and closing and has a short life due to the arcing that results, especially when it is opened and the load is inductive. Unidirectional solid state switches have been used, but they create significant amounts of RFI even when on, dissipate a great deal of power and are subject to destruction from current overload and voltage spikes. They may also be turned on after opening by excessive dV/dt when switching inductive loads. In addition, they have moderate off-state leakage current. Whereas bidirectional solid state relays can solve some of these problems, they cannot solve all of them.

BRIEF DESCRIPTION OF THE INVENTION

This invention involves connecting a unidirectional solid state switch such as an SCR or a TRIAC in parallel with the mechanical switch of a relay between an input to which alternating current voltage is to be applied and an output to which a load is to be coupled. When the output is to be connected to the input, the mechanical switch of the relay is closed after the solid state switch and the latter may be left closed. Preferably, however, it is then opened. When the output is to be disconnected from the input, the solid state switch is closed, if not already closed, and the mechanical switch of the relay is opened. A short time later, the solid state switch is also opened. Thus, when the mechanical switch of the relay is being opened or closed, the voltage across it is the low voltage of one volt or so across the solid state switch.

Connection of the output to the input is effected at zero volts by triggering the solid state switch just prior to the time when the AC voltage crosses its axis in a direction that will turn on the switch. If the relay is commanded to close its mechanical switch at the time the solid state switch is triggered and the timing of the triggering is properly selected, the relay will close its mechanical switch shortly after the AC voltage has crossed its axis.

Disconnection of the output from the input at zero current may be effected by signalling the relay so that it will open its mechanical switch near the peak of the AC voltage and triggering the solid state switch to close if it is not already closed. Thus, when the current passes through zero, the solid state switch will open.

In order to synchronize the operation of the switching with the AC voltage, two clock signals are derived: one having a low state during the negative half-cycles of the AC voltage at the input, and the other being 180° out of phase with the first. It is also necessary to derive a third signal that lags the first clock signal by approximately 90°. In accordance with another aspect of this invention, the third clock signal is derived in such manner as to be insensitive to the frequency of the AC voltage, thereby permitting the hybrid switch to function as desired for 50-cycle as well as 60-cycle line voltages. This is accomplished by integrating one of the clock signals in two separate means which have significantly different time constants and applying the integrated signals to a comparator.

As will be explained in greater detail, the switching apparatus of this invention provides over-current protection, freedom from re-turn-on that can be caused in other switches when the switch is opened and the load is inductive, no off-state leakage and minimal RFI.

DETAILED DESCRIPTION OF THE INVENTION

Figure 1:
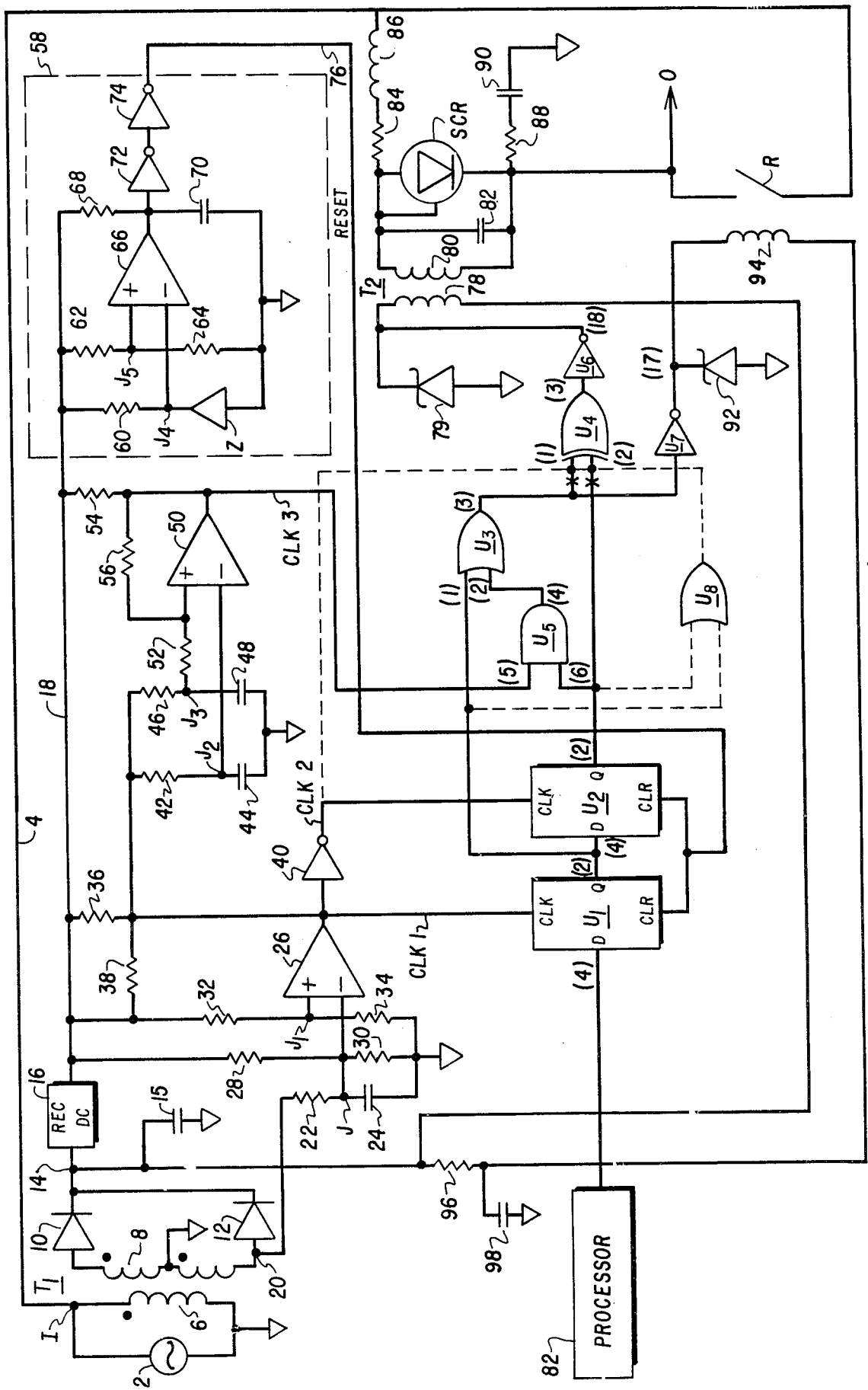
FIG. 1 is a schematic diagram of switching apparatus embodying this invention.

In FIG. 1, a source 2 of alternating current voltage is connected between ground and an input I that is connected via a line 4 and a parallel combination of a switch SCR and a mechanical switch R of a relay to an output O. Control of the switches SCR and R in the desired sequence and under the desired condition of voltage or current may be effected by the following logic circuits.

Figure 2:
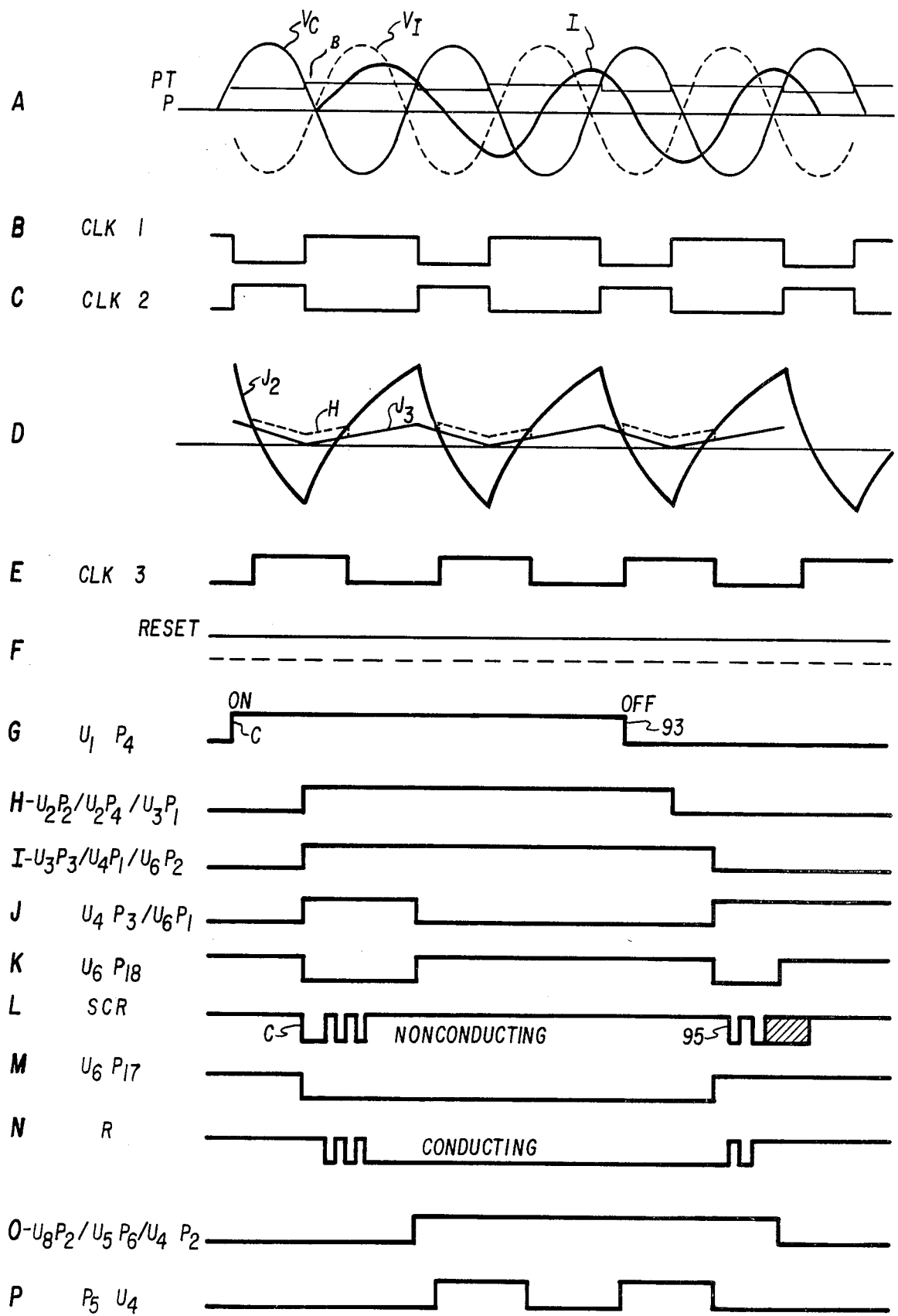
FIGS. 2A through 2P are a series of graphs used in explaining the operation of FIG. 1.

Consider first the portion of the logic circuit that derives clock pulses that are to be used for relating the operation of the switches SCR and R to the alternating current voltage at the input I. A primary winding 6 of a transformer $T_1$ is coupled between ground and the input I and the ends of a center-tapped secondary winding 8 of $T_1$ are connected to a common point 14 via diodes 10 and 12 so as to produce an unregulated direct voltage that is smoothed by a capacitor 15. This voltage is regulated by a power supply 16 and supplied to a bus 18. The AC voltage at the input I is indicated by the dashed-line wave $V_I$ of FIG. 2A. Its axis is AC ground or neutral but it is shown, for convenience of illustration, as being at a positive voltage P. The AC voltage that appears at the point 20, which is the junction of the lower half of the secondary winding 8 and the diode 12, is 180° out of phase with $V_I$ because of the indicated winding senses. The axis of this latter voltage is also AC neutral but it is shifted to P, as illustrated by the solid line $V_C$ of FIG. 2A, in the following manner. A resistor 22 and a capacitor 24 are connected in the order named between the point 20 and floating ground. A resistor 28 is connected between the bus 18 of regulated DC voltage and a junction J of the resistor 22 and the capacitor 24, and a resistor 30 is connected between the junction J and floating ground. The values of the resistors are such as to cause the axis of the AC wave at the junction J to be at a positive voltage P that is greater than the amplitude of the wave. The solid line wave $V_C$ of FIG. 2A appears at the junction J and is coupled to the inverting input of a comparator 26. A resistor 32 and a resistor 34 are connected in series between the bus 18 of regulated DC voltage and floating ground and are of such values as to cause the DC voltage at their junction $J_1$, which is connected to the non-inverting input of the comparator 26, to be more positive than the axis P as indicated at P+ in FIG. 2A. A pull-up resistor 36 is connected between the bus 18 and the output of the comparator 26, and a feedback resistor 38 is connected between its output and the bus 18. Thus, as indicated in FIG. 2B, when $V_C$ is greater than P+, the output of the comparator 26 has a low state and, when it passes down through P+, the output of the comparator 26 has a high state. Because of the feedback resistor 38, a high state at the output of the comparator 26 raises the voltage of the junction $J_1$ as indicated at B so as to provide hysteresis. The wave illustrated by FIG. 2B is hereinafter referred to as CLK 1. A signal CLK 2 is derived from CLK 1 by simply inverting it with an inverter 40.

A signal CLK 3 of FIG. 2E that lags CLK 1 by approximately 90° is derived as follows. A resistor 42 and a capacitor 44 are connected in series in the order named between the output of the comparator 26 where CLK 1 appears and floating ground so as to form an integration circuit having such a time constant as to produce at the junction $J_2$ of the resistor 42 and the capacitor 44 a wave such as $J_2$ of FIG. 2D. A resistor 46 and a capacitor 48 are connected in series in the order named between the output of the comparator 26 and floating ground so as to form another integration circuit having such a time constant as to produce at the junction $J_3$ of the resistor 46 and the capacitor 48 a wave such as indicated by the solid line $J_3$ of FIG. 2D. The junction $J_2$ is connected to the inverting input of a comparator 50, and the junction $J_3$ is connected via a resistor 52 to the non-inverting input of the comparator 50. A pull-up resistor 54 is connected between the output of the comparator 50 and the bus 18 of regulated DC voltage, and a feedback resistor 56 is connected between the output of the comparator 50 and its non-inverting input. The resistors 52 and 56 operate to provide hysteresis as indicated by the dashed line H of FIG. 2D whenever the voltage at $J_3$ exceeds the voltage at $J_2$. The output of the comparator 50 is the signal CLK 3 of FIG. 2E.

In order to prevent operation of the logic circuits until the regulated DC voltage on the bus 18 has nearly achieved its desired value, a power sense circuit shown in the dashed-line rectangle 58 is provided that produces a delayed reset signal only when this condition is achieved. The circuit 58 includes a first voltage divider comprised of a resistor 60 and a zener diode Z connected in series in the order named between the bus 18 of regulated DC voltage and floating ground and a second voltage divider comprised of series resistors 62 and 64 connected between the bus 18 and floating ground. The junction $J_4$ of the resistor 60 and zener diode Z is connected to the inverting input of a comparator 66, and the junction $J_5$ of the resistors 62 and 64 is connected to its non-inverting input. A resistor 68 is connected between the bus 18 and the output of the comparator 66, and a capacitor 70 is connected between that output and floating ground. Because of the non-linearity of the diode Z, the voltage at the junction $J_4$ is greater than the voltage at the junction $J_5$ when the regulated DC voltage is low. This causes the output of the comparator 66 to be low. When the regulated DC voltage on the bus 18 gets close enough to the desired value, the voltage at $J_5$ exceeds the voltage at $J_4$ so as to cause the comparator output to attempt to go high and charge the capacitor 70 through the resistor 68. This provides a delay of a few seconds. The output of the comparator 66 is applied via inverters 72 and 74 connected in series to a reset line 76 that is connected to the clear inputs of two D flipflops $U_1$ and $U_2$. Because the inverters have hysteresis, the voltage applied to the reset line 76 is digital.

Control signals for causing the switching apparatus to connect or disconnect the input I from the output O may be supplied from any source such as a processor 82 to a D input, pin (4), of the flipflop $U_1$. Hereinafter, the pin numbers of the various logic devices will be within parentheses and the word "pin" will not be used. In this particular circuit, a high state control signal causes the switching apparatus to connect the input I to the output O and a low state control signal causes the switching apparatus to disconnect the input I from the output O. The output of the source 82 is connected to input (4) of $U_1$ that is clocked by CLK 1, and the output (2) of $U_1$ is connected to the D input (4) of $U_2$ as well as to one input (1) of an OR gate $U_3$. The output (2) of $U_2$ which is clocked by CLK 2 is connected to one input (2) of an XOR gate $U_4$ and to one input (6) of an AND gate $U_5$. The other input (5) of the AND gate $U_5$ is connected to CLK 3, and its output (4) is connected to the other input (2) of the OR gate $U_3$. The output (3) of the OR gate $U_3$ is connected to the other input (1) of the XOR $U_4$. Its output (3) is connected to the input of an inverter $U_6$ having its output (18) connected to one end of a primary winding 78 of a pulse transformer $T_2$. The other end of the primary winding 78 is connected to the point 14 on which unregulated DC voltage appears. A zener diode 79 is connected between the output (18) and floating ground. The secondary winding 80 of $T_2$ is shunted by a capacitor 82 and has one end connected to the trigger electrode of the solid state switch SCR. The other end of the winding 80 is connected to the cathode of SCR. Therefore, when the output (18) of $U_6$ has a low state, the trigger electrode is pulsed so as to condition SCR for conduction.

A resistor 84 and an inductor 86 are connected in series between the anode of SCR and the AC line 4, and a resistor 88 and a capacitor 90 are connected in series between the cathode of SCR and AC neutral. The resistor 84 limits the peak current that can flow through SCR, the inductor 86 limits the di/dt so as to prevent destruction of the SCR, and the resistor 88 and capacitor 90 limit the dv/dt and therefore limit the RFI when the load is inductive and SCR is being turned off.

The output (3) of $U_3$ is also applied to the input of an inverter $U_7$ having a zener diode 92 connected between its output (17) and floating ground. The output (17) is connected via a relay coil 94 for operating the mechanical switch R and a resistor 96 to the point 14 where the unregulated DC voltage appears. A capacitor 98 is connected between the junction of the resistor 96 and the coil 94 and floating ground. Thus, when the output (17) of $U_7$ is in a low state, the mechanical switch R is closed. The initial voltage applied to the relay coil 94 is the full unregulated DC voltage across the capacitor 98, but after the mechanical switch R is closed the voltage is reduced by the resistor 96.

The operation of the switching apparatus just described is as follows. Assume that the reset is high as indicated at FIG. 2F and further assume that the input I is to be connected to the output O. The processor 82 introduces a high state voltage at the input (4) of $U_1$ as indicated at C in FIG. 2G. On the next positive-going edge of CLK 1, the output (2) of $U_1$ is latched high. This output is connected to the input (1) of $U_3$ and also to input (4) of $U_2$ as indicated in FIG. 2H. Thus, the OR gate $U_3$ has at least one high input so that its output (3) goes high, as indicated in FIG. 2I. This output is applied to the input (1) of the XOR $U_4$ and to the input 1 of $U_7$. Since the output (2) of $U_2$ is still low, the XOR $U_4$ has only one high input so that its output (3) goes high, FIG. 2J. This causes the output (18) of $U_6$ to go low, FIG. 2K, and apply an enabling voltage to the trigger electrode of SCR, thereby conditioning it for conduction. Note that this occurs just a little prior to the time when the AC voltage $V_I$ passes upwardly through its axis. When this occurs, SCR is closed as indicated at C in FIG. 2L.

The high at the output (3) of $U_3$ is also applied to the input 1 of the inverter $U_7$ so that its output (17) goes low as indicated at FIG. 2M. A few milliseconds later, the mechanical switch R makes its first closure, $C^1$, and may bounce as indicated in FIG. 2N before being fully closed. FIGS. 2L and 2N respectively illustrate the current flowing through SCR and R. When R is closed, practically all of the current flows through it. Any bounces of R produce very little RFI because the SCR can conduct and has a low voltage across it. The mechanical switch R will stay closed until it is commanded to open. On the next positive transition of CLK 2, the output 2 of $U_2$ is latched high. There are now two high inputs to the XOR $U_4$ so that its output (3) goes low FIG. 2J. The output (18) of $U_6$ goes high, FIG. 2K, and the pulse transformer $T_2$ is turned off. $T_2$ is of sufficient size to pass a pulse of at least one-half of an AC line cycle. No further action occurs with respect to SCR until $U_1$ is clocked off.

Disconnecting the input I from the output O is achieved as follows. First, the processor 82 supplies a low state, as indicated at 93 of FIG. 2G, to the input (4) of $U_1$. On the next positive edge of CLK 1, $U_1$ latches the low signal on its input (4) to its output (2). This low signal is also applied to input (1) of the OR gate $U_3$ and to the input (4) of $U_2$, FIG. 2H. Note that after the input I was connected to the output O, the output (4) of the AND gate $U_5$ followed CLK 3, FIG. 2P. Thus, with the next low of CLK 3, the output (4) of the AND gate $U_5$ goes low so that the OR gate $U_3$ has two low inputs and its output (3) is low. This low is applied to the input (1) of the XOR gate $U_4$, FIG. 2I, so that it has one high and one low input and outputs a high which is inverted by $U_6$ to make its output (18) low and allow SCR gate current to flow. A millisecond or so later, SCR conducts current as indicated at 95 of FIG. 2L. At the same time that the low signal from the output (3) of $U_3$, FIG. 2I, arrives at the input 1 of $U_4$, it arrives at the input of $U_7$ and causes its output (17) to go high, FIG. 2M. The relay opens the mechanical switch R in a few milliseconds, FIG. 2N, and SCR carries the load current. There may be a few bounces of R as shown. When CLK 2 goes high, about one-fourth of a cycle later, the low at input (4) of $U_2$ is latched to its output (2). Both inputs (1) and (2) of the XOR gate $U_4$ are now low so that its output (3) is low. This makes the output (18) of $U_6$ go high, FIG. 2K, so as to allow SCR to open, FIG. 2L, when the current in the load illustrated by the line I of FIG. 2A passes through zero.

When the control signal, FIG. 2G, indicates that contact is to be established between the input I and the output O, the SCR switch is pre-triggered so that the SCR switch automatically turns on at the next AC voltage crossover if there is any load. This insures turn-on at zero volts. The relay coil 94 is energized at a time that will permit it to close the mechanical switch R before the next voltage crossover.

When the control signal, FIG. 2G, indicates that the input I is to be disconnected from the output O, the pre-triggering of the SCR switch in response to CLK 3 preferably occurs just prior to an AC voltage peak having such polarity that the current is in a direction to turn on the SCR switch. The relay coil 94 is de-energized at such time, conveniently the same time as the pre-triggering, and must open the mechanical switch R before the next crossover of the current, wave I of FIG. 2A. The worst case is when the load is resistive because the mechanical switch R must be opened within a quarter of a cycle. If the load is inductive, the mechanical switch R has a half-cycle in which to open.

Note that there is isolation between switching elements and the control elements via R, $T_2$ and $T_1$.

The advantage of deriving CLK 3 with the integration circuits 42, 44 and 46, 48 and the comparator 50 is that the approximate 90° lag of CLK 3 with respect to CLK 1 will not be affected by a change in the frequency of the AC voltage applied at the input I so that the hybrid power switch can operate with both 50-cycle and 60-cycle line frequencies.

An alternative mode of operation in which SCR can conduct current from a time before the mechanical switch R closes until a time after R opens may be achieved by respectively connecting the inputs of an OR gate $U_8$ to the output (2) of $U_2$ and to the output (2) of $U_1$, connecting the output of $U_8$ to one input (2) of the XOR gate $U_4$, and connecting CLK 2 to the other input (1) of $U_4$. As indicated by the x's, the inputs (1) and (2) of $U_4$ are respectively disconnected from the output (3) of $U_3$ and the output(2) of $U_2$.

What is claimed is:

1. Switching apparatus between an input to which an alternating current voltage may be applied and an output, comprising means responsive to alternating current voltage, when present at said input, for deriving a first clock signal having a low state during a portion of alternate half-cycles of said alternating current voltage and a high state in between, means responsive to alternating current voltage, when present at said input, for deriving a second clock signal that is out of phase with said first clock signal, means responsive to said first clock signal for deriving a third clock signal that lags one of said first and second clock signals by 90°, a source of control signals having a high state when said switching apparatus is to provide a connection between said input and said output, and a low state when said switching apparatus is to provide an open circuit between said input and said output, first and second D-type flipflops, connected in series, said source of control signals being connected to the input of said first flipflop, and the clock inputs of said flipflop being respectively connected to said means for providing said first clock signal and said means for providing said second clock signal, an AND gate having an output, one input connected to the output of said second flipflop, and the other input connected to said means for providing said third clock signal, an OR gate having an output, one input connected to the output of said second flipflop and the other input connected to the output of said AND gate, an EXCLUSIVE OR gate having an output, one input connected to the output of said second flipflop and its other input connected to the output of said OR gate, an inverter and a primary winding of a transformer connected in series between the output of said EXCLUSIVE OR gate and a point of positive DC voltage, an SCR device having an activating electrode, an anode and a cathode, a secondary winding of said transformer connected between said electrode and cathode of said SCR device, another inverter and a relay coil connected in series between the output of said OR gate and a point of positive DC voltage, said relay coil having a mechanical switch operated thereby, and means connecting said SCR device and said mechanical switch in parallel between said input and said output.

2. Switching apparatus as set forth in claim 1 wherein said means responsive to said first clock signal for deriving the third clock signal comprises first and second integration means coupled to said means for deriving said first or second clock signal, said first and second integration means having different time constants, and a comparator having inputs respectively connected to said first and second integration means whereby said third clock signal appears at the output of said comparator.

* * * * *